United States Patent
Tan et al.

Patent Number: 6,117,179
Date of Patent: Sep. 12, 2000

[54] HIGH VOLTAGE ELECTRICAL RULE CHECK PROGRAM

[75] Inventors: Alexius H. Tan, Fremont; Shane Hollmer, San Jose, both of Calif.; Jonathan Su, Evanston, Ill.

[73] Assignee: Advanced Micro Devices, Inc., Sunnyvale, Calif.

[21] Appl. No.: 09/028,121

[22] Filed: Feb. 23, 1998

[51] Int. Cl.[7] .................................................. G06F 9/455
[52] U.S. Cl. ................................................ 703/14; 716/4
[58] Field of Search ........................ 395/500.02, 500.05, 395/500.12, 500.06, 500.07, 500.09, 500.27, 500.34, 500.35, 500.39, 500.36, 500.19, 701; 345/507

[56] References Cited

U.S. PATENT DOCUMENTS

| | | | |
|---|---|---|---|
| 5,220,512 | 6/1993 | Watkins et al. | 395/500.12 |
| 5,371,851 | 12/1994 | Pieper et al. | 345/507 |
| 5,528,508 | 6/1996 | Russell et al. | 395/500.09 |
| 5,717,928 | 2/1998 | Campmas et al. | 395/701 |
| 5,867,399 | 2/1999 | Rostoker et al. | 395/500.19 |

*Primary Examiner*—Kevin J. Teska
*Assistant Examiner*—Dan Fiul
*Attorney, Agent, or Firm*—Fliesler, Dubb, Meyer & Lovejoy

[57] ABSTRACT

An electrical rule check program takes simulation output files as input and performs an electrical rule check on the simulation to determine if any electrical design rules have been violated. The program scans a simulation output file to produce a subcircuit name list, an instance name list, and an internal index list for each subcircuit. If the number of circuit nodes is less than a first predetermined value, a window limit is set to equal the number of nodes times the number of data points. If the number of nodes is greater than the first predetermined value and less than a second predetermined value, then the window limit is set to equal some first predetermined fraction of the product of the number of nodes and the number of data points. If the number of nodes is greater than the second predetermined value, then the window limit is set to equal some second predetermined fraction of the product of the number of nodes and the number of data point, where the second predetermined fraction is less than the first predetermined fraction. The program then scans the simulation output file to produce an indexed node name list and a corresponding indexed voltage list to fill the window. The program performs the electrical rule checks and prints itemized report and statistics information. Each violation type supported by the electrical rule check program according to the present invention has a corresponding own violation output file. Currently supported rule types apply to junction breakdown, punch through, and gate oxide breakdown.

24 Claims, 14 Drawing Sheets

Pseudo Code

*Reading Node Names*
For each node found in data file {
    Increment node counter, Node_count
    If (Node_count < 1,000)
        set Window_limit=Node_count x Datapoints
    else if (Node_count > 1,000)&&(Node_count<10,000)
        set Window_limit=Node_count x Datapoints x 10%
    else if (Node_count > 10,000)
        set Window_limit=Node_count x Datapoints x 1%
}

*Reading Node Voltages, V(t)*
For each node
    If (DataSize < Window Limit){
        Store Voltage Values
    }else{
        Trim DataSize (only use time points as specified in user's Analysis Command)
}

```
Read Node Name          Read Voltage
from Simulation  ──→    from Simulation  ──→
Output File             Output File
```

*FIG. 6*

Pseudo Code (cont'd)

```
For each element {
    Check transistor type
    Find index from node list for each transistor terminal
                                    (drain, source, gate, bulk)

For each voltage point {
        Find index of drain, source, gate and bulk
        voltage in voltage list
    }

For each simulation time point {
        Find violation type to be done (gate_oxide breakdown,
                                        junction oxide breakdown, punch-thru)
        Initialize violation flags
        Use index to locate and retrieve voltage values for all
                                        transistor terminals
        Do violation checks
        Print violation
    }

Reset violation flags.
}
```

FIG. 7

Prepare for Checks → Perform ERC Violation Checks

Device Types

| Type | Description | (a) Donuted Thin Ox. | (b) No-donut Thin Ox. | (c) Donuted Thin Ox. | (d) No-donut Thin Ox. |
|---|---|---|---|---|---|
| 1 | N-Channel Enhancement in P-substrate | nmosSD, nmosDD, nmosfSD | nmos, nmosf, nmosT | | |
| 2 | N-Channel Intrinsic in P-substrate | imosSD, imosDD | imos | imosSDHVTC, imosDDHVTC | |
| 3 | N-Channel Enhancement in P-well | N/A | nmosT | | |
| 4 | N-Channel Intrinsic in P-well | imosTSD, imosTDD | imosT | | |
| 5 | P-Channel in Deep N-well | pmosSD, pmosDD | pmosT | | |
| 6 | P-Channel in N-well | | pmos4, pmos, pmosf | | pmos4HVTC |

Violation Types

| Violation Type | Violation # | Description | Device Types | Output File |
|---|---|---|---|---|
| Gate Oxide Break-down | 1A | Vgs > 10 volts | all types thin oxide | v1A_Gate_Nox.rpt |
| | 1B | Vgd > 10 volts | all types thin oxide | v1B_Gate_Nox.rpt |
| | 1C | P-channel: if Vgb > 0 and \|Vgb\| > 10 volts<br>N-channel: if Vgb < 0 and \|Vgb\| > 10 volts | all types thin oxide | v1C_Gate_Nox.rpt |
| | 1D | Vgs > 18 volts | all types thin oxide | v1D_Gate_Kox.rpt |
| | 1E | Vgd > 18 volts | all types thin oxide | v1E_Gate_Kox.rpt |
| Junction Break-down | 2A | Vsb, Vdb max > 10 volts | undonuted N-channel & P-channel, Thin/Thick Oxide | v2A_Junc_All.rpt |
| | 2B | Vsb, Vdb max > 10 volts | Donuted undonuted N-channel & P-channel, Thin/Thick Oxide | v2B_Junc_All.rpt |
| | 2C | Single donuted:<br>if Vsb > 10 volts<br>Double donuted:<br>if 2 < Vgb < 2 ; Vsb mas > 10 volts<br>if 5 < Vgb < 5; Vsb max > 12 volts<br>if 9 < Vgb < 9; Vsb max > 16 volts<br>if 9 < Vgb ; Vsb max > 18 volts | Donuted N-channel Intrinsic, Thin/Thick Oxide | v2C_Junc_All.rpt | if Vgb<2; Vdb max>10 volts

| Violation Type | Violation # | Description | Device Types | Output File |
|---|---|---|---|---|
| Junction Breakdown (cont'd) | 2D | Single donuted:<br>if Vdb > 10 volts<br>Double donuted:<br>if Vgb < 2; Vdb max > 10 volts<br>if 2 < Vgb < 5; Vdb max > 12 volts<br>if 5 < Vgb < 9; Vdb max > 16 volts<br>if 9 < Vgb ; Vdb max > 18 volts | Donuted N-channel Intrinsic, Thin/Thick Oxide | v2D_Junc_All.rpt |
| | 2E | Single donuted:<br>if Vsb > 10 volts<br>Double donuted:<br>if Vgb < 2; Vsb max > 10 volts<br>if 2 < Vgb < 5; Vsb max > 12 volts<br>if 5 < Vgb < 9; Vsb max > 15 volts<br>if 9 < Vgb ; Vsb max > 16 volts | Donuted N-channel in P-sub, Thin Oxide | v2E_Junc_All.rpt |
| | 2F | Single donuted:<br>if Vdb > 10 volts<br>Double donuted:<br>if Vgb < 2; Vdb max > 10 volts<br>if 2 < Vgb < 5; Vdb max > 12 volts<br>if 5 < Vgb < 9; Vdb max > 15 volts<br>if 9 < Vgb ; Vdb max > 16 volts | Donuted N-channel in P-sub, Thin Oxide | v2F_Junc_All.rpt |
| | 2G | Single donuted:<br>if Vsb > 10 volts<br>Double donuted:<br>if Vgb < 2; Vsb max > 10 volts<br>if 2 < Vgb < 5; Vsb max > 12 volts<br>if 5 < Vgb < 9; Vsb max > 13.5 volts<br>if 9 < Vgb ; Vsb max > 14.5 volts | Donuted N-channel Intrinsic in P-well, Thin Oxide | v2G_Junc_All.rpt |
| | 2H | Single donuted:<br>if Vdb > 10 volts<br>Double donuted:<br>if Vgb < 2; Vdb max > 10 volts<br>if 2 < Vgb < 5; Vdb max > 12 volts<br>if 5 < Vgb < 9; Vdb max > 13.5 volts<br>if 9 < Vgb ; Vdb max > 14.5 volts | Donuted N-channel Intrinsic in P-well, Thin Oxide | v2H_Junc_All.rpt |

*FIG. 12*

| Violation Type | Violation # | Description | Device Types | Output File |
|---|---|---|---|---|
| Junction Break-down (cont'd) | 2I | Single donuted:<br>if Vdb > 10 volts<br>Double donuted:<br>if Vgb > -2; Vdb max > -10 volts<br>if -2 < Vgb < -5; Vdb max > -11 volts<br>if -5 < Vgb < -9; Vdb max > -15 volts<br>if -9 < Vgb ; Vdb max > -16 volts | Donuted P-channel in Deep N-well Thin Oxide | v2I_Junc_All.rpt |
| | 2J | Single donuted:<br>if Vdb > 10 volts<br>Double donuted:<br>if Vgb < -2; Vdb max > -10 volts<br>if -2 < Vgb < -5; Vdb max > -11 volts<br>if -5 < Vgb < -9; Vdb max > -15 volts<br>if -9 < Vgb ; Vdb max > -16 volts | Donuted P-channel in Deep N-well Thin Oxide | v2J_Junc_All.rpt |
| Punch Thru | 3A | Vds > 7 volts and L < 1.0u | N-channel on P-sub or P-well Thin Oxide | v3A_Punch_Thru.rpt |
| | 3B | Vds > 10 volts | All types | v3B_Punch_Thru.rpt |
| | 3C | Vds > 7 volts and L < 1.2u | Undonuted N-channel Intrinsic on P-sub Thin Oxide | v3C_Punch_Thru.rpt |
| | 3D | Vds > 7 volts and L < 1.0u | P-channel on N-well Thin Oxide | v3D_Punch_Thru.rpt |
| | 3E | Vds > 7 volts and L < 1.1u | Undonuted N-channel in Deep Nwell Thin Oxide | v3E_Punch_Thru.rpt |

*FIG. 13*

HIGH VOLTAGE ELECTRICAL RULE CHECK PROGRAM

BACKGROUND OF THE INVENTION

1. Field of the Invention

The present invention relates to the field of electrical rule checking of integrated circuit designs. Specifically, the present invention relates to computer-aided analysis of circuit simulator output for high voltage MOS design rule violations.

2. Discussion of the Related Art

In MOS integrated circuit design, it is necessary to guarantee that certain electrical design rules are never violated. For example, in MOS devices, if the voltage across the gate oxide exceeds the amount which can be handled by the gate oxide, a charge transfer may rupture the gate oxide, causing device failure or unreliability. This is called gate oxide breakdown.

Similarly, if the voltage from the source to drain or drain to source is too large to be carried by the channel of a MOS device, a large current may "punch through" the channel, causing circuit failure and sometimes damaging the device due to excessive heating. This is particularly true at small channel lengths and high voltages. Another type of failure occurs if the source or drain voltage of a MOS device is too high relative to the bulk. Here, the source or drain to bulk junction may breakdown, causing erroneous unintended circuit behavior.

These types of problems can be avoided by formulating and following certain high voltage electrical design rules.

In most low-voltage MOS integrated circuits, the circuit can be designed so that all the transistors will behave properly and will not be damaged under any normal operating circumstances. In other words, the highest specified supply voltages will never cause the any of the internal MOS devices to fail or operate improperly.

However, flash memory devices utilize the internal generation of high voltages which are much higher than the highest supply voltages of the devices. It is difficult to guarantee that these high voltage design rules will never be violated.

Circuit designers frequently use circuit simulators such as SPICE to perfect circuit performance and to attempt to develop circuits which adhere to the electrical design rules. In order to guarantee adherence to the high voltage electrical design rules, it is desirable to be able to detect high voltage design rule violations that have occurred in a simulation. However, the transistor models used in these simulators typically do not model transistor failure or breakdown. Rather, the user must carefully monitor the transistor's circuit nodes to verify that none of the conditions which might cause problems have happened.

Traditionally, flash memory designers verify their circuits iteratively using the HSPICE circuit simulator and then analyze the result using Graphical User Interface such as GSI. This process relies heavily on the designer's assumptions regarding which critical nodes are to be verified. With modern non-volatile circuit designs, both the design complexity and the process technology are so advanced that a method is needed for verifying that the resulting design is within a tolerable specification.

Moreover, conventional methods used by flash memory designers only focused on high voltage nodes and iteratively monitored the voltage levels over a specified period of time. This is not practical due to the highly distributed existence of high voltage nodes for modern flash memory architectures.

Manual checking is a very difficult because the high voltage electrical design rules themselves are non-linear voltage dependent rules which require monitoring voltage differentials between several dynamic nodes for each transistor. In the past circuit designers have relied upon manual checking of simulation reports and visual graphical analysis of simulation reports to try to detect high voltage design rule violations. This manual checking is tedious and very error prone.

As discussed above, prior methods of checking for potential electrical rules violations involved using manual selective and tedious checks on schematics or circuit simulation results. This approach is error prone since it relies on the designer's accuracy and ability to spot problems through a lot of simulation data. Parts that were overlooked by the designer, and thus not checked, could lead to an unreliable product or potentially product failure.

As is apparent from the foregoing discussion, a need exists for an automated system for checking a circuit for high voltage design rule violations.

SUMMARY OF THE INVENTION

Conventionally high voltage design rule checking has been performed manually by resorting to tedious and error prone examination of simulation outputs.

According to the present invention, a reliable and exhaustive electrical rule check program performs the detection of electrical rule violations during design inceptions, prior to layout creation or fabrication. This prevents potential failures of the fabricated silicon and is done at minimal time compared with the conventional, limited checks.

According to the present invention, a post-simulation analysis method embodied in the electrical rule check program checks all nodes captured in the HSPICE simulation transient analysis file data file for each transistor type for any potential violation related to gate oxide breakdown, junction breakdown, or punch through.

The electrical rule check program ensures that voltage stress limits of each targeted part is met at a given operating and process condition. The limit and conditions are defined in the electrical design rules (EDR) book of the corresponding process technology. Any violation will be compiled and printed in separate report files that correspond to any of twenty one implemented rules.

The electrical rule check program takes simulation output files as input and performs an electrical rule check on the simulation to determine if any electrical design rules have been violated. The program scans a simulation output file to produce a subcircuit name list, an instance name list, and an internal index list for each subcircuit. If the number of circuit nodes is less than a first predetermined value, a window limit is set to equal the number of nodes times the number of data points. If the number of nodes is greater than the first predetermined value and less than a second predetermined value, then the window limit is set to equal some first predetermined fraction of the product of the number of nodes and the number of data points. If the number of nodes is greater than the second predetermined value, then the window limit is set to equal some second predetermined fraction of the product of the number of nodes and the number of data point, where the second predetermined fraction is less than the first predetermined fraction. In the preferred embodiment, the first predetermined value is 1,000, the second predetermined value is 10,000, the first predetermined fraction is 0.1, and the second predetermined fraction is 0.01. The program then scans the simulation output file to produce an indexed node name list and a corresponding indexed voltage list to fill the window. The program performs the electrical rule checks and prints itemized report and statistics information. Each violation type supported by the electrical rule check program according to the present invention has a corresponding own violation output file. Currently supported rule types apply to junction breakdown, punch through, and gate oxide breakdown.

These and other features and advantages of the present invention will be apparent from the Figures in conjunction with the Detailed Description of the Invention.

BRIEF DESCRIPTION OF THE DRAWINGS

FIG. 6 illustrates the method for reading the node names from the simulation output file and setting the window limit and the method for reading the node voltages from the simulation output file according to the present invention.

FIG. 7 illustrates the method for preparing for rule checking, performing rule checking, and reporting the results of the rule checking performed by the electrical rule check program according to the present invention.

FIG. 10 illustrates the various device types supported by the electrical rule check program according to the present invention.

FIG. 11 illustrates some of the various violation types detected by the electrical rule check program according to the present invention, including gate oxide breakdown violations and junction breakdown violations.

FIG. 12 illustrates more of the various junction breakdown violation types detected by the electrical rule check program according to the present invention.

FIG. 13 illustrates more of the various violation types detected by the electrical rule check program according to the present invention, including more types of junction breakdown violation types and punch through violations.

The Figures are more fully explained in the Detailed Description of the Invention. In FIGS. 1 through 14, like parts are identified by like numerals. The thousands and hundreds digit of each reference numeral indicates which Figure the part is first instantiated in.

DETAILED DESCRIPTION OF THE INVENTION

Figure 1:
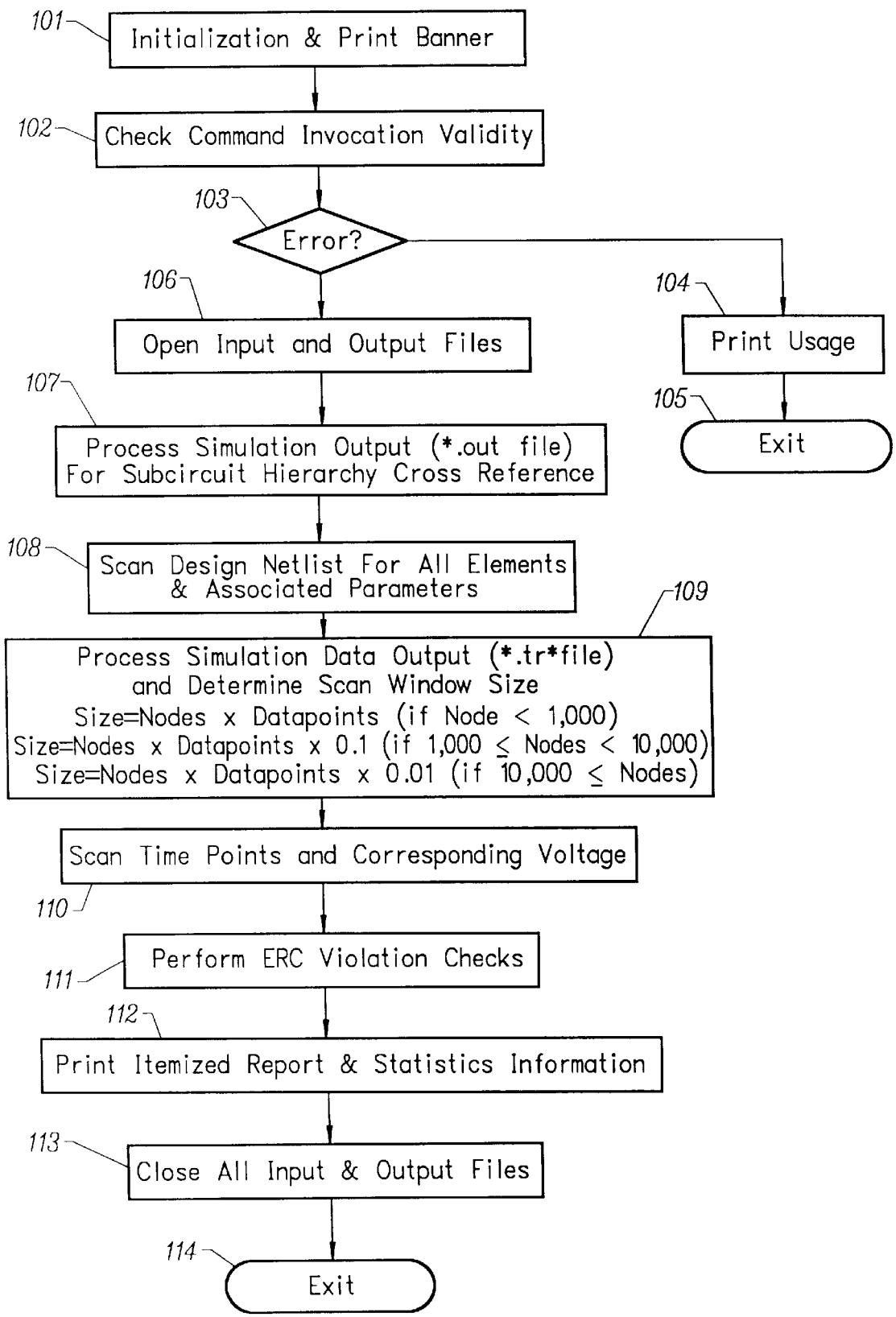
FIG. 1 is a flow chart illustrating the steps in performing an electrical rule check according to the present invention.

High voltage circuit designers have previously relied upon manual inspection of circuit simulation waveforms to attempt to located high voltage rule violations. This has been tedious and error prone. According to the present invention as described below, an electrical rule check program detects high voltage violations and reports violations to the user.

The input to the electrical rule check program according to the present invention are two files: HSPICE .tr file and HSPICE .out file. These HSPICE generated files contain both simulation data and circuit topology that are required by the electrical rule check program. In order to generate these files, proper option commands must be included in the HSPICE control deck. Normally, there are two input files needed for running the HSPICE simulation:

(1) my_file.net

This file contains the netlist generated through running EENET. This netlist should be generated with HSPICE netlist (EENET based) version 2.4 or later. This is required since older netlister version does not support device type registration necessary for doing violation checks. One way to check for correct netlist is by ensuring that no \?undefined\ string exists on any transistor element; instead, each of them should have a component name that starts with a dollar sign "$". For example, $imos, $pmos4, or $nmos appearing at the end of the line specify a component name. The netlist may be either hierarchical or flat. The electrical rule check program according to the present invention supports both formats.

(2) my_file.dat

This file contains control statements and input biasing for simulation. The .tran command in this file will be used by the electrical rule check program to determine the number of datapoints required for analysis.

HSPICE job submission through the Spice Interface (SI) must be done with -post option. For example:

si -post <cr>

Otherwise, no .tr* file will be retrieved back to the user directory.

Three options should be specified in the user data file. For example:

.OPTIONS POST=2 INGOLD=2 LIST

The option post=2 is used to have ASCII format .tr* file from HSPICE run. The option ingold=2 is to indicate the proper data format (exponential). The option LIST is to instruct HSPICE in printing the simulated circuit elements inside the out file. This command must be placed after the call to the model files. Thus, after .inc '{model path name}'. Similarly, it should be placed outside any option .protect or .pc brief, otherwise the anticipated information will be suppressed at the .out file. As a safeguard, placing the option statement prior to END statement will ensure correct output generation.

The electrical rule check program requires two input files:

(1) my_file.tr0

This file contains the data points, node names, time points, and voltage values for the circuit being simulated.

(2) my_file.out

This file contains the print back of design netlist as found in my_file.net and the control file my_file.dat. In addition, the element topology, hierarchy and pin information, are also available in this file.

To invoke the electrical rule check program according to the present invention, the user enters: hvcheck -tr my_file.out -{analysis_type} In the above command my_file.tr0 contains the nodes, time, and voltage information and my_file.out contains the element topology, types, and analysis range. Analysis_type could be one of the following:

GOB Gate oxide breakdown; which performs checks related to potential gate oxide breakdown. There are a total of five checks.

JB Junction breakdown; which performs checks for potential junction breakdown. There are a total of ten checks.

PT Punch Through; which performs checks for any punch through related violations. There are a total of six checks.

There are a total of twelve device types currently supported by the electrical rule check program according to the present invention. which includes elements from a high voltage CMOS component library. For each transistor element the component type will be parsed and categorized into one of these twelve types. Passive devices and other transistor types, such as MOS capacitances, are ignored.

The component identifier (which starts with a $ sign at the end of each transistor element) in the netlist may have other values other than those stated in FIG. 10. For example $pxfr and $nxfr are translated into type pmos and nmos, respectively. Similarly, $icap, $pcap, $ncap, and $nwicap may be present but are ignored during analysis.

A total of twenty-one violations have been incorporated into the electrical rule check program according to the present invention. The violations are categorized into three groups: gate oxide breakdown, junction breakdown, and punch through as tabulated in FIGS. 11–13.

The preferred embodiment of the electrical rule check program according to the present invention is written in PERL (Practical Extraction and Report Language), which was chosen for faster development and ease of maintenance. The software environment has been qualified with the following dependencies:

(1) PERL version 5.001:

The earlier version of PERL would cause memory leak which jeopardizes the electrical rule check capacity in handling large simulation.

(2) HSPICE version 93a02:

Any other version of HSPICE may support different output format which may affect the electrical rule check inputs.

(3) HSPICE netlister version 2.4 or later:

This version supports device registering.

(4) GSI version 9007.

GSI (Graphical Simulation Interface) is a waveform viewer.

A component library and test suite must also be provided.

The electrical rule check software according to the present invention was written to facilitate rule checks prior to layout or during design inception. The violation check coverage, however, is still dependent on proper biasing or test vector application done by designers. Similarly, the electrical rule check program also depends on the accuracy of the HSPICE generated output.

Figure 9:
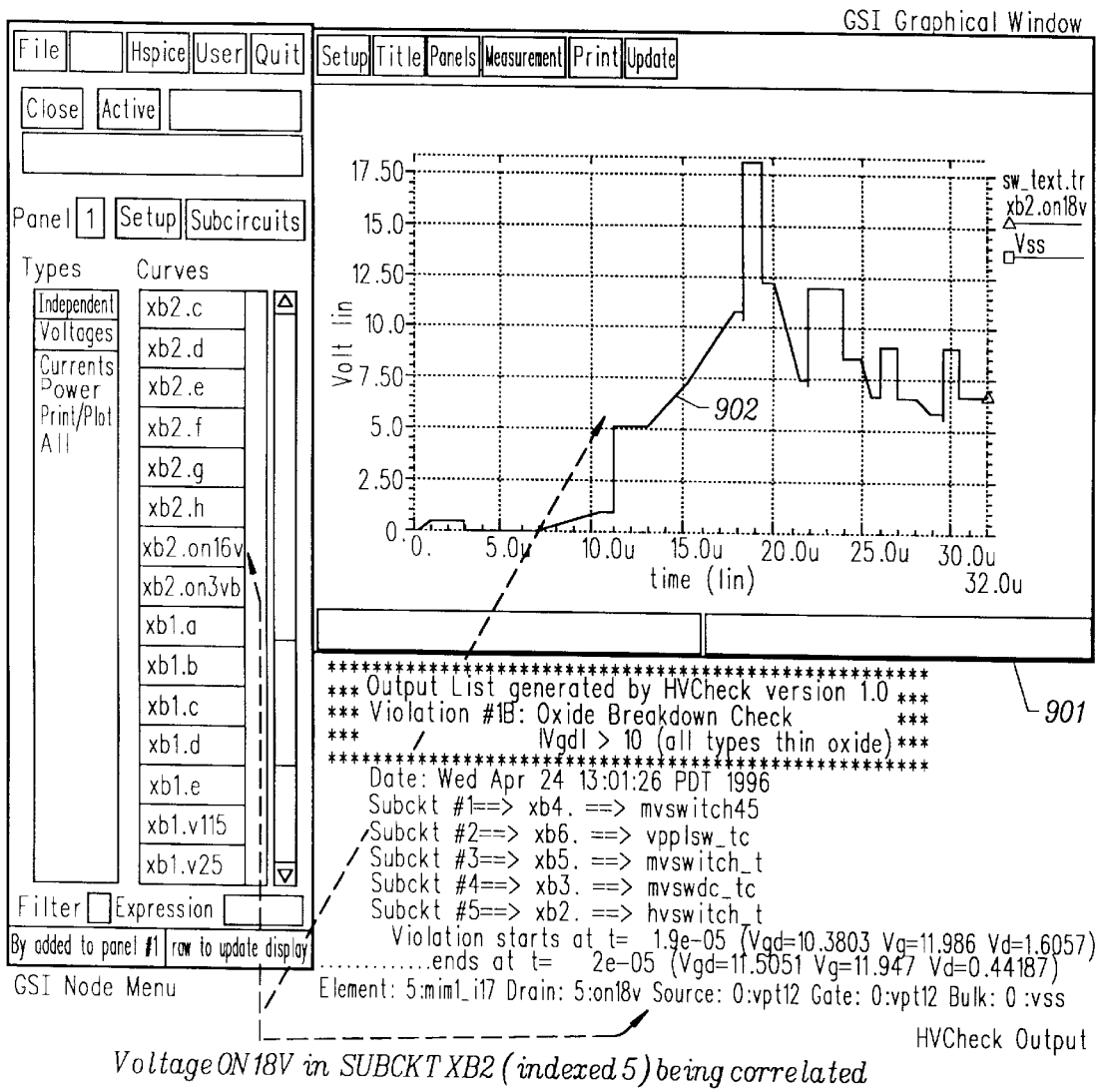
FIG. 9 illustrates correlation of the violation reports and the simulation output according to the present invention using a graphical simulation interface.

FIG. 9 illustrates correlation using GSI. Subcircuit cross-referencing is included at the header of each output file.

FIG. 1 is a flowchart illustrating the method carried out by the electrical rule check program according to the present invention. Referring to FIG. 1, at step 101 the initialization and print banner is first printed. At step 102, the command invocation is checked for validity and syntax errors. If the command is invalid, step 103 directs the flow to step 104, where the user is notified of the error before the program exits 105.

If the command is valid, the input and output files are opened at step 106. The simulation output file (*.out file) is scanned for sub-circuit hierarchy cross references. At step 108, the design netlist is scanned for all elements and associated parameters.

At step 109, the simulation data output file (*.tr* file) is scanned to determine the scan window size. If the number of nodes is less than 1,000, the size of the window limit is set to equal the number of nodes times the number of data points. If the number of nodes is between 1,000 and 10,000, the size of the window limit is set to equal one tenth of product of the number of nodes and the number of data points. If the number of nodes is greater than 10,000, the size of the window limit is set to equal the product of the number of nodes and the number of data points divided by one hundred.

At step 110, the time points and corresponding node voltages are scanned in. At step 111, the various electrical rule violation checks are performed. At step 112, the itemized reports and statistics information is printed. At step 113, all input and output files are closed before the program exits 114.

Figure 2:
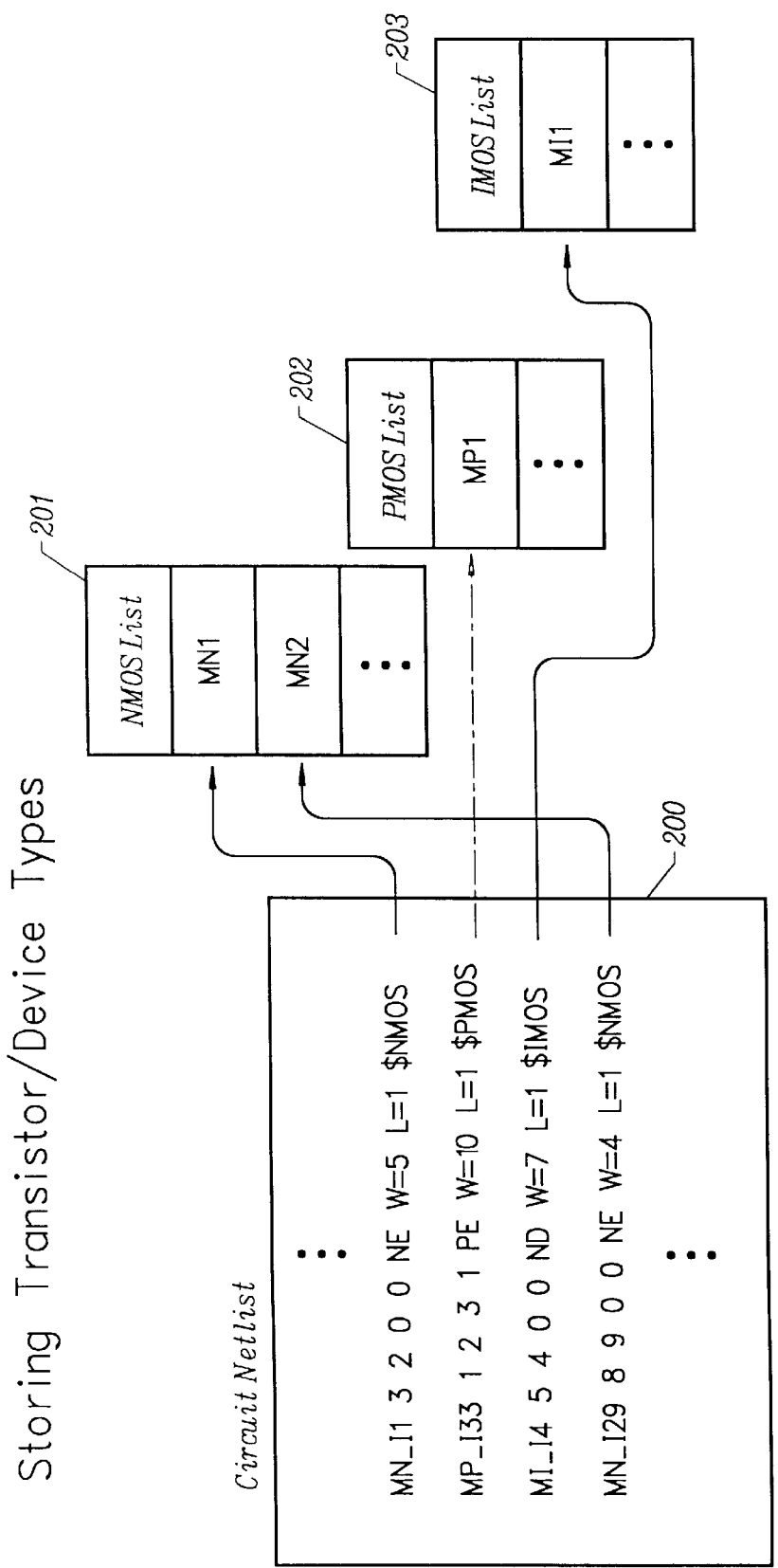
FIG. 2 illustrates the data structures that the electrical rule check program according to the present invention uses to store the transistor device types.

FIG. 2 illustrates the data structures used to store the device types. Each unique device type has a list of instances associated with it. For example, an NMOS list 201, a PMOS list 202, and an IMOS list 203 are formed in step 108 by scanning the netlist 200.

Figure 3:
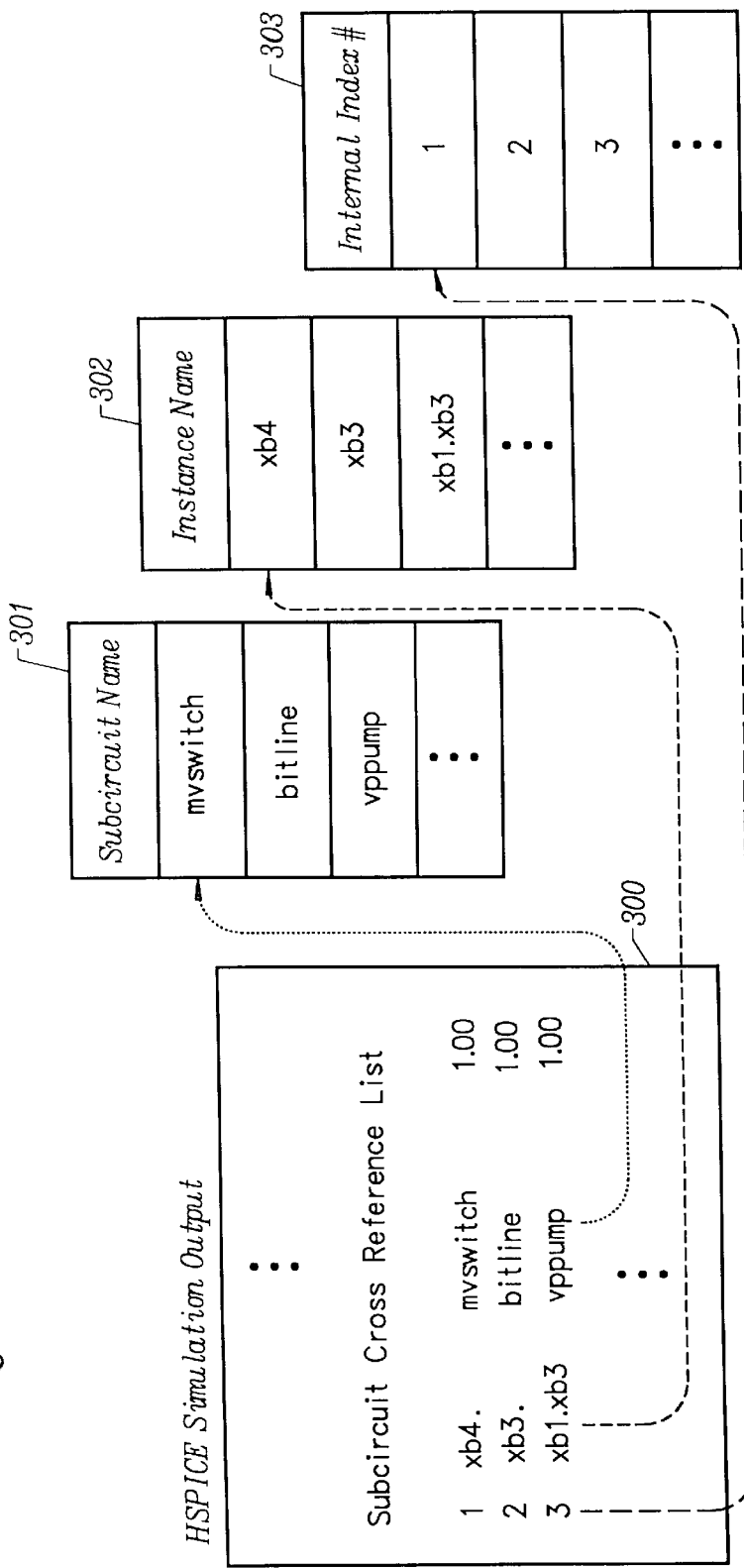
FIG. 3 illustrates the data structures that the electrical rule check program according to the present invention uses to store the circuit topology information.

FIG. 3 illustrates the circuit topology data structures which are built in step 107 by processing the simulation output file 300. A subcircuit name list 301, an instance name list 302, and an internal index list 303 are built at step 107.

Figure 4:
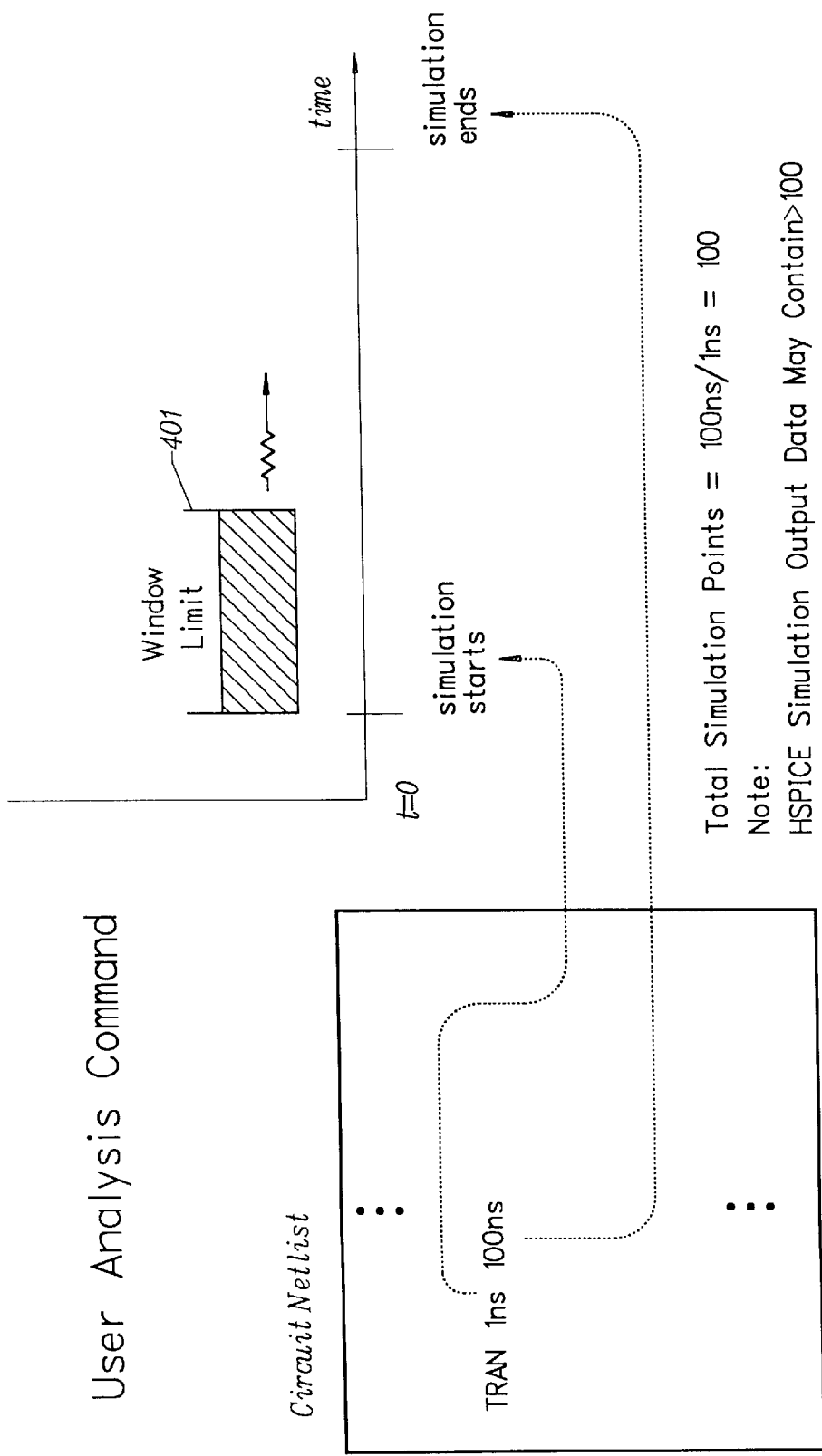
FIG. 4 illustrates the window limit which may be set by the electrical rule check program according to the present invention.

FIG. 4 illustrates the effect of the window limit 401 which is established at step 109.

Figure 5:
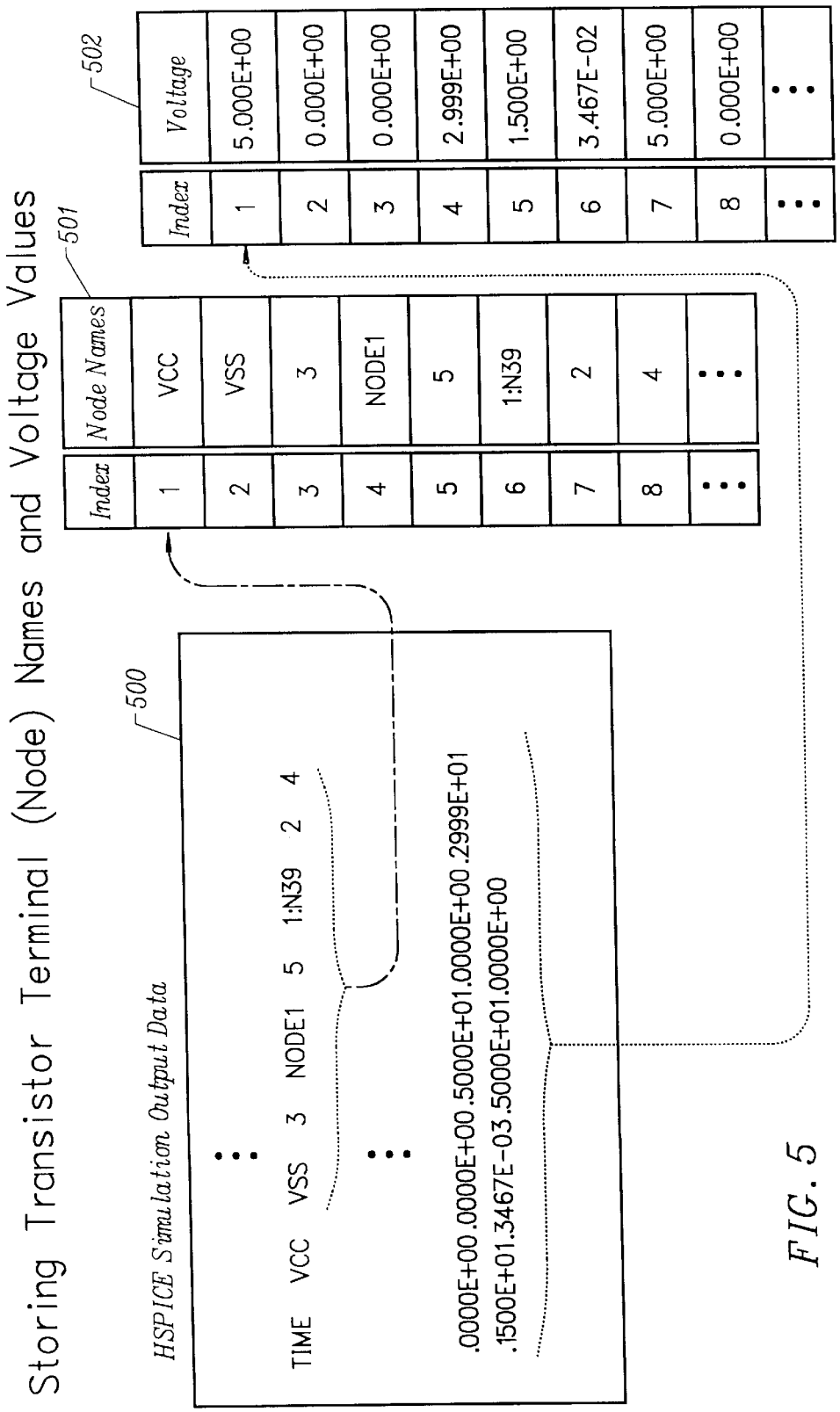
FIG. 5 illustrates the data structures that the electrical rule check program according to the present invention uses for storing transistor terminal node names and voltage values.

FIG. 5 illustrates the data structures used to store the node names and voltage values. The HSPICE simulation output file includes output data 500 organized by time, node name, and voltage value. A node name list 501 and voltage list 502 are built at step 110.

FIG. 6 illustrates the method for reading the node names and setting the window limit at step 109, and reading the node voltages at step 110. FIG. 7 illustrates the method for preparing for the checks and performing the checks at step 111 and printing the results at step 112.

Figure 8:
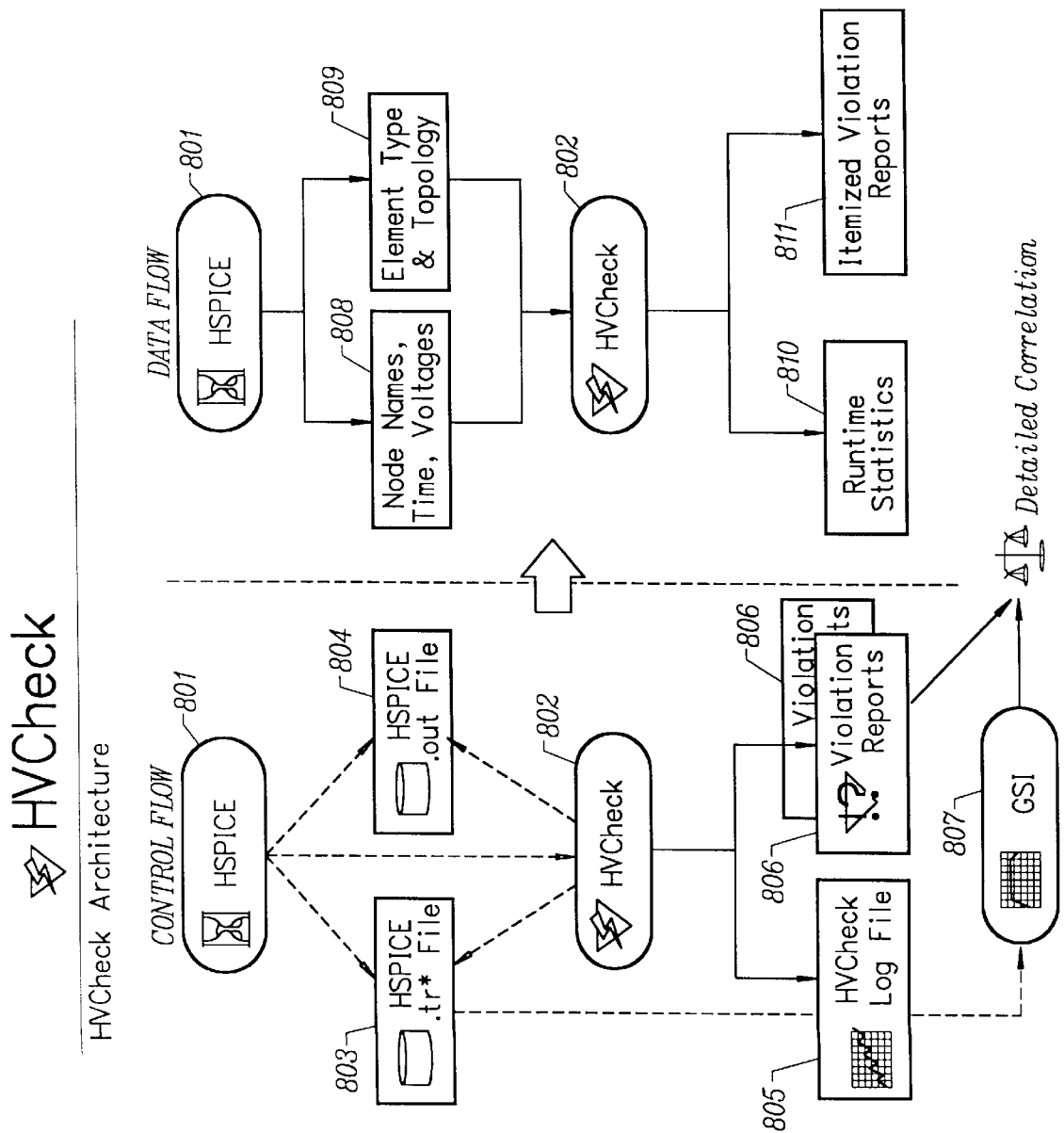
FIG. 8 illustrates the environment of the electrical rule check program according to the present invention, including the control flow and data flow.

FIG. 8 illustrates the control flow and data flow of the electrical rule check program (HVCheck) according to the present invention. HSPICE 801 produces the HSPICE .tr* file and the HSPICE .out file 804. HVCheck 802 then reads the HSPICE .tr and HSPICE out file. The HVCheck log file 805 and various violation report files 806 are produced by HVCheck 802. The GSI interface 807 uses the HVCheck log file 805 and the violation report files 806 to help the user to correlate the reports to the simulation waveforms.

HSPICE 801 produces the simulation data points 808 and the element type and topology information 809. The simulation data points 808 and the topology information 809 are used by HVCheck 802. HVCheck 802 produces runtime statistics 810 for the log file 805 and produces itemized violation reports 806 for the violation report files 811.

FIG. 9 illustrates a GSI graphical window 901 which is displaying a simulation output waveform 902. FIG. 10 illustrates the various device types which are supported by the electrical rule check software according to the present invention. FIGS. 11 through 13 show the various violation types which the electrical rule check program checks for according to the present invention.

Figure 14:
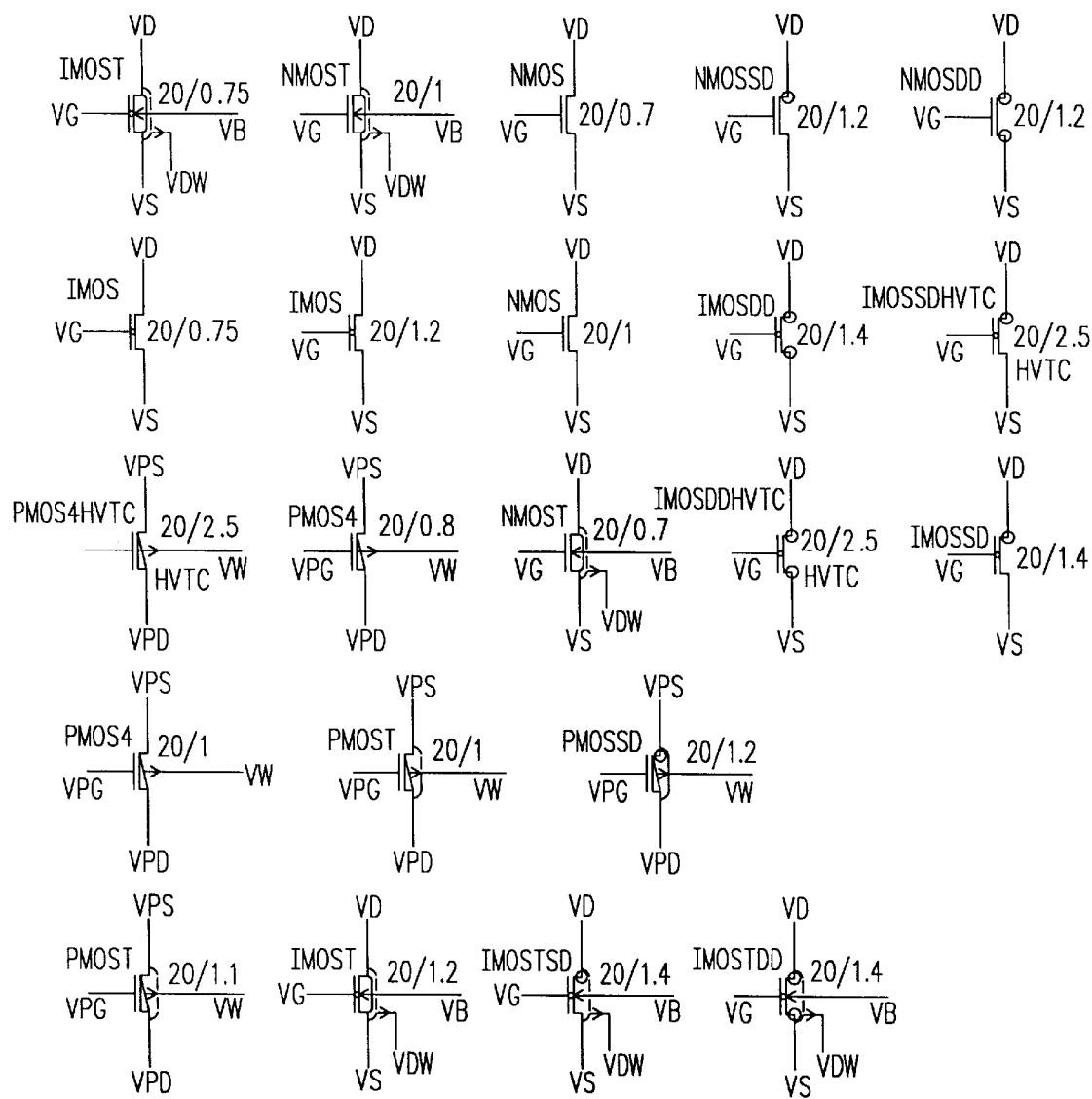
FIG. 14 illustrates the various transistor types which are supported by the electrical rule check program according to the present invention and listed in FIG. 10.

FIG. 14 illustrates the various device types which are listed in FIG. 10 that are supported by the electrical rule check program according to the present invention.

While the present invention has been described with reference to its preferred embodiment, that embodiment is offered by way of example, not by way of limitation. For example, various other electrical rules aside from the ones explicitly described in the preferred embodiment may be checked. As another example, a different circuit simulator other than HSPICE may be used. Those skilled in the art will be enabled by this disclosure to add to or modify the various methods and apparatuses described herein without departing from the spirit and scope of the present invention. Those various additions and modifications are deemed to lie within the spirit and scope of the invention as set forth in the appended claims.

What is claimed is:

1. A method of performing an electrical rule check on a simulation of a circuit design, the method comprising the steps of:

receiving a command invocation;

determining a number of node names in the circuit design;

determining a number of datapoints in the simulation of the circuit design;

if the number of node names in the circuit design is less than a first predetermined value, setting a window limit specifying a size of a rule check window to equal the number of node names times the number of datapoints;

if the number of node names in the circuit design is greater than or equal to the first predetermined value, setting the window limit specifying the size of the rule check window to equal a first predetermined fraction of the number of node names times the number of datapoints;

scanning simulation data into the rule check window;

detecting electrical rule violations from the simulation data in the rule check window; and displaying on a graphical simulation interface a simulation waveform corresponding to one of the electrical rule violations.

2. A method as in claim 1, further comprising the step of, prior to the scanning step:

if the number of node names in the circuit design is greater than or equal to a second predetermined value, setting the window limit specifying the size of the rule check window to equal a second predetermined fraction of the number of node names times the number of datapoints.

3. A method as in claim 1, further comprising the step of:

after the detecting step and prior to the displaying step, generating an electrical rule violation output file.

4. A method as in claim 3, further comprising the step of:

displaying on the graphical simulation interface a portion of the electrical rule violation output file that corresponds to the simulation waveform simultaneously being displayed on the graphical simulation interface.

5. A method as in claim 1, wherein the step of detecting electrical rule violations comprises the step of:

detecting gate oxide breakdown violations.

6. A method as in claim 1, wherein the step of detecting electrical rule violations comprises the step of:

detecting junction oxide breakdown violations.

7. A method as in claim 1, wherein the step of detecting electrical rule violations comprises the step of:

detecting punch through violations.

8. A method as in claim 1, wherein the step of receiving the command invocation includes the steps of:

receiving an indication of a netlist file corresponding to the circuit design; and receiving an indication of a simulation output file corresponding to the circuit.

9. A method as in claim 8, wherein the step of determining the number of node names in the circuit design comprises the step of:

counting the number of node names in the simulation output file corresponding to the circuit.

10. A method as in claim 9, wherein the step of determining the number of datapoints in the simulation of the circuit design comprises the step of:

determining a number of time points in the simulation output file corresponding to the circuit.

11. A method as in claim 1, wherein the step of generating an electrical rule violation output file includes the step of:

for each electrical rule violation, generating an indication of a start time and an end time of the electrical rule violation.

12. A method as in claim 11, further comprising the step of:

displaying on the graphical simulation interface the indication of the start time and the end time of the electrical rule violation that corresponds to the simulation waveform simultaneously being displayed on the graphical simulation interface.

13. A computer readable storage medium comprising:

computer readable program code for programming a computer to perform an electrical rule check on a simulation of a circuit design, the method comprising the steps of:

receiving a command invocation;

determining a number of node names in the circuit design;

determining a number of datapoints in the simulation of the circuit design;

if the number of node names in the circuit design is less than a first predetermined value, setting a window limit specifying a size of a rule check window to equal the number of node names times the number of datapoints;

if the number of node names in the circuit design is greater than or equal to the first predetermined value, setting the window limit specifying the size of the rule check window to equal a first predetermined fraction of the number of node names times the number of datapoints;

scanning simulation data into the rule check window;

detecting electrical rule violations from the simulation data in the rule check window; and displaying on a graphical simulation interface a simulation waveform corresponding to one of the electrical rule violations.

14. A computer readable storage medium as in claim 13, wherein the method further comprises the step of, prior to the scanning step:

if the number of node names in the circuit design is greater than or equal to a second predetermined value, setting the window limit specifying the size of the rule check window to equal a second predetermined fraction of the number of node names times the number of datapoints.

15. A computer readable storage medium as in claim 13, wherein the method further comprises the step of:

after the detecting step and prior to the displaying step, generating an electrical rule violation output file.

16. A computer readable storage medium as in claim 15, wherein the method further comprises the step of:

displaying on the graphical simulation interface a portion of the electrical rule violation output file that corresponds to the simulation waveform simultaneously being displayed on the graphical simulation interface.

17. A computer readable storage medium as in claim 13, wherein the step of detecting electrical rule violations comprises the step of:

detecting gate oxide breakdown violations.

18. A computer readable storage medium as in claim 13, wherein the step of detecting electrical rule violations comprises the step of:

detecting junction oxide breakdown violations.

19. A computer readable storage medium as in claim 13, wherein the step of detecting electrical rule violations comprises the step of:

detecting punch through violations.

20. A computer readable storage medium as in claim 13, wherein the step of receiving the command invocation includes the steps of:

receiving an indication of a netlist file corresponding to the circuit design; and receiving an indication of a simulation output file corresponding to the circuit.

21. A computer readable storage medium as in claim 20, wherein the step of determining the number of node names in the circuit design comprises the step of:

counting the number of node names in the simulation output file corresponding to the circuit.

22. A computer readable storage medium as in claim 21, wherein the step of determining the number of datapoints in the simulation of the circuit design comprises the step of:

determining a number of time points in the simulation output file corresponding to the circuit.

23. A computer readable storage medium as in claim 13, wherein the step of generating an electrical rule violation output file includes the step of:

for each electrical rule violation, generating an indication of a start time and an end time of the electrical rule violation.

24. A computer readable storage medium as in claim 23, wherein the method further comprises the step of:

displaying on the graphical simulation interface the indication of the start time and the end time of the electrical rule violation that corresponds to the simulation waveform simultaneously being displayed on the graphical simulation interface.

* * * * *